United States Patent
Olsen et al.

(10) Patent No.: US 9,431,319 B2
(45) Date of Patent: Aug. 30, 2016

(54) EXPOSED, SOLDERABLE HEAT SPREADER FOR INTEGRATED CIRCUIT PACKAGES

(71) Applicant: LINEAR TECHNOLOGY CORPORATION, Milpitas, CA (US)

(72) Inventors: Edward William Olsen, San Jose, CA (US); Leonard Shtargot, Campbell, CA (US); David Roy Ng, San Jose, CA (US); Jeffrey Kingan Witt, Oakland, CA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 0 days.

(21) Appl. No.: 14/630,239

(22) Filed: Feb. 24, 2015

(65) Prior Publication Data

US 2016/0035644 A1 Feb. 4, 2016

Related U.S. Application Data

(60) Provisional application No. 62/032,347, filed on Aug. 1, 2014.

(51) Int. Cl.
*H01L 23/10* (2006.01)
*H01L 23/367* (2006.01)
(Continued)

(52) U.S. Cl.
CPC ......... *H01L 23/3675* (2013.01); *H01L 21/486* (2013.01); *H01L 23/3107* (2013.01);
(Continued)

(58) Field of Classification Search
CPC ............. H01L 23/36; H01L 23/49568; H01L 23/481; H01L 23/3107; H01L 23/486; H01L 23/4334; H01L 23/5389

USPC .......................... 257/707, 713, 787, E23.051
See application file for complete search history.

(56) References Cited

U.S. PATENT DOCUMENTS 5,111,278 A * 5/1992 Eichelberger ......... H01L 23/473
                                                      257/698
5,497,033 A * 3/1996 Fillion ................... H01L 21/568
                                                      257/700

(Continued)

FOREIGN PATENT DOCUMENTS

FR          2666687 A1   3/1992
JP       11-514149 A   11/1999

(Continued)

OTHER PUBLICATIONS

USPTO. 2015. Office Action, dated Oct. 20, 2015, for U.S. Appl. No. 14/630,302, filed Feb. 24, 2015, entitled "Exposed, Solderable Heat Spreader for Flipchip Packages," Edward William Olsen et al., inventors.

(Continued)

*Primary Examiner* — Nitin Parekh
(74) *Attorney, Agent, or Firm* — McDermott Will & Emery LLP

(57) ABSTRACT

An integrated circuit package may include a semiconductor die, a heat spreader, and encapsulation material. The semiconductor die may contain an electronic circuit and exposed electrical connections to the electronic circuit. The heat spreader may be thermally-conductive and may have a first outer surface and a second outer surface substantially parallel to the first outer surface. The first outer surface may be affixed to all portions of a silicon side of the semiconductor die in a thermally-conductive manner. The encapsulation material may be non-electrically conductive and may completely encapsulate the semiconductor die and the heat spreader, except for the second surface of the heat spreader. The second surface of the heat spreader may be solderable and may form part of an exterior surface of the integrated circuit package.

16 Claims, 9 Drawing Sheets

(51) Int. Cl.
*H01L 23/31* (2006.01)
*H01L 23/48* (2006.01)
*H01L 23/433* (2006.01)
*H01L 23/498* (2006.01)
*H01L 21/48* (2006.01)
*H01L 23/538* (2006.01)
*H01L 23/00* (2006.01)

(52) U.S. Cl.
CPC ......... *H01L23/4334* (2013.01); *H01L 23/481* (2013.01); *H01L 23/49827* (2013.01); *H01L 23/49861* (2013.01); *H01L 23/5384* (2013.01); *H01L 23/5389* (2013.01); *H01L 24/19* (2013.01); *H01L 24/24* (2013.01); *H01L 24/82* (2013.01); *H01L 2224/04105* (2013.01); *H01L 2224/16245* (2013.01); *H01L 2224/32245* (2013.01); *H01L 2224/73253* (2013.01); *H01L 2224/73267* (2013.01); *H01L 2224/83005* (2013.01)

(56) References Cited

U.S. PATENT DOCUMENTS

| | | | | |
|---|---|---|---|---|
| 5,565,706 | A * | 10/1996 | Miura | H01L 23/13 257/691 |
| 6,265,771 | B1 | 7/2001 | Ference et al. | |
| 6,271,469 | B1 * | 8/2001 | Ma | H01L 21/56 174/521 |
| 6,495,914 | B1 * | 12/2002 | Sekine | H01L 23/5389 257/706 |
| 8,482,118 | B2 * | 7/2013 | Mohan | H01L 21/4853 257/698 |
| 2004/0115862 | A1 | 6/2004 | Kung et al. | |
| 2007/0035033 | A1 * | 2/2007 | Ozguz | H01L 21/4803 257/777 |
| 2007/0290303 | A1 | 12/2007 | Lange | |
| 2009/0115035 | A1 | 5/2009 | Bayan et al. | |
| 2009/0283919 | A1 | 11/2009 | Tsui et al. | |
| 2010/0124802 | A1 | 5/2010 | Chiang et al. | |
| 2012/0025388 | A1 * | 2/2012 | Law | H01L 25/0657 257/773 |
| 2012/0162947 | A1 | 6/2012 | O'Donnell et al. | |
| 2012/0193814 | A1 | 8/2012 | Dunne et al. | |

FOREIGN PATENT DOCUMENTS

| | | |
|---|---|---|
| JP | 2008042063 A | 2/2008 |
| KR | 10-2012-0071360 A1 | 7/2012 |
| WO | 9702600 A1 | 1/1997 |

OTHER PUBLICATIONS

European Search Report Issued Jan. 4, 2016 in related European Application No. 15002262.2.

Korean Intellectual Property Office. 2016. Notice of Reason for Rejection for Korean Application No. 10-2015-0106264, entitled "Exposed Solderable Heat Spreader for Integrated Flip Chips" (Korean counterpart to instant application).

* cited by examiner

EXPOSED, SOLDERABLE HEAT SPREADER FOR INTEGRATED CIRCUIT PACKAGES

CROSS-REFERENCE TO RELATED APPLICATION

This application is based upon and claims priority to U.S. provisional patent application 62/032,347, entitled "Exposed Backside Heat-Spreader for Embedded Die Package," filed Aug. 1, 2014. The entire content of this application is incorporated herein by reference.

BACKGROUND

1. Technical Field

This disclosure relates to integrated circuit packaging technology, including embedded die packages, flipchip packages, and other types of packages that are configured to be mounted to a printed circuit board (PCB).

2. Description of Related Art

Integrated circuit packages, such as embedded die packages and flipchip packages, may contain a semiconductor die on which one or more electronic circuits are fabricated. The semiconductor die may be embedded, as in an embedded die package, or attached to a wire frame, as in a flipchip package. There may be multiple semiconductor dies stacked in a single package.

The electronic circuits within these packages may generate significant heat during operation. If this heat is not quickly removed, the electronic circuit may be damaged and/or not perform properly. Quick removal of this heat, therefore, may be important.

Thin lateral conductive traces have been used to remove heat. However, they may not remove heat as fast as may be needed or desired. They may also add complexities to the connection requirements of the integrated circuit package.

SUMMARY

An integrated circuit package may include a semiconductor die, a heat spreader, and encapsulation material. The semiconductor die may contain an electronic circuit and exposed electrical connections to the electronic circuit. The heat spreader may be thermally-conductive and have a first outer surface and a second outer surface substantially parallel to the first outer surface. The first outer surface may be affixed to all portions of a silicon side of the semiconductor die in a thermally-conductive manner. The encapsulation material may be non-electrically conductive and may completely encapsulate the semiconductor die and the heat spreader, except for the second surface of the heat spreader. The second surface of the heat spreader may be solderable and may form part of an exterior surface of the integrated circuit package.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Figure 1A:
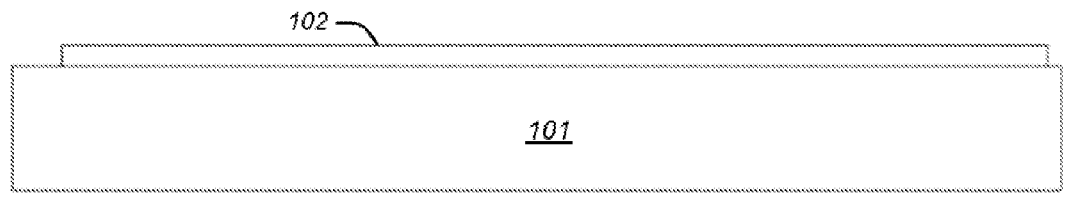
FIGS. 1A-1R illustrate an example of a process for creating an integrated circuit package, such as an embedded die package, that contains a heat spreader that has a solderable surface that forms part of an exterior surface of the integrated circuit package.
Figure 1B:
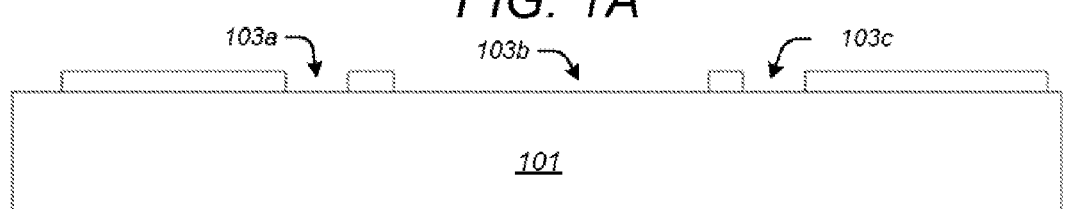
Figure 1C:
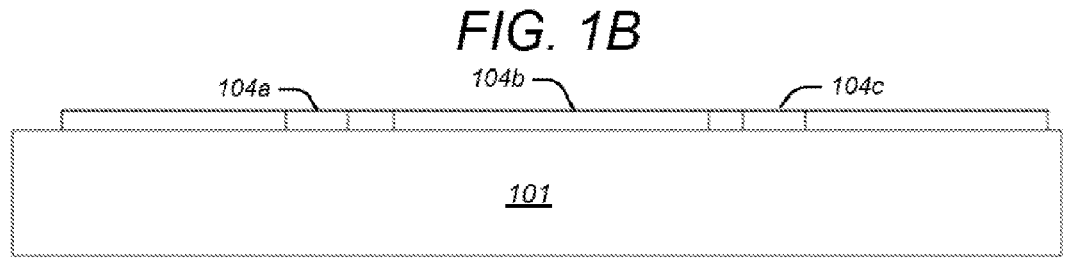
Figure 1D:
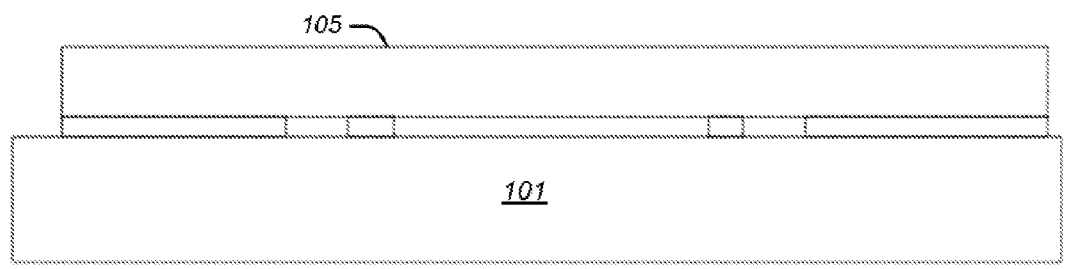
Figure 1E:
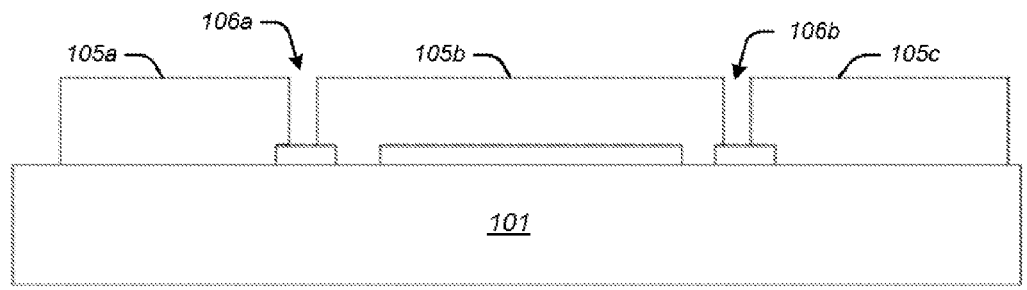
Figure 1F:
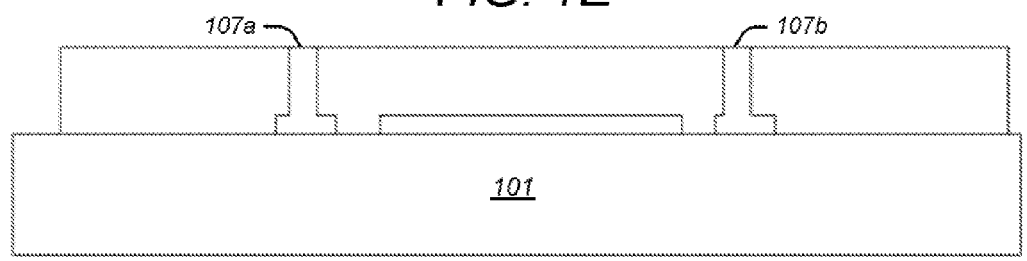
Figure 1G:
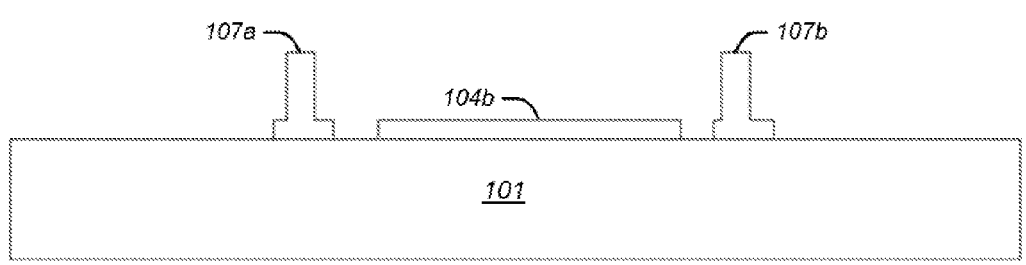
Figure 1H:
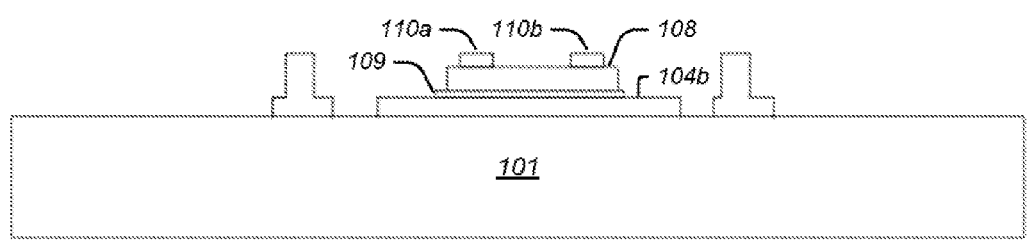
Figure 1I:
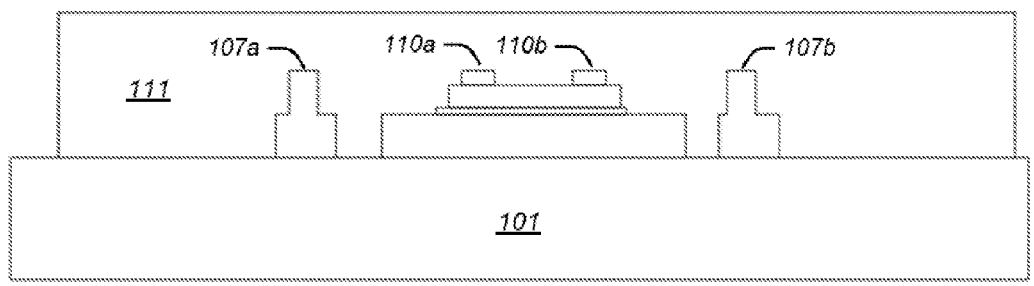
Figure 1J:
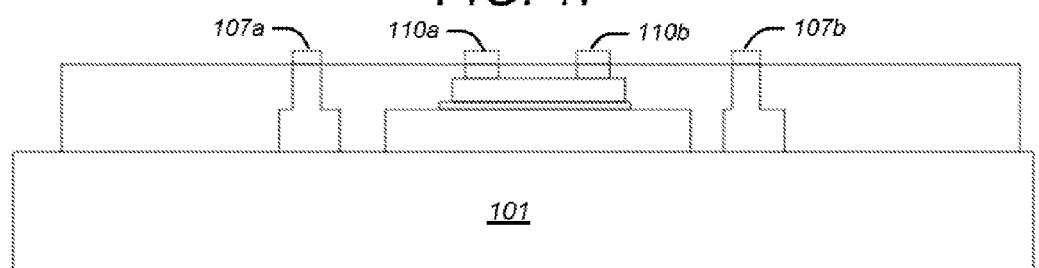
Figure 1K:
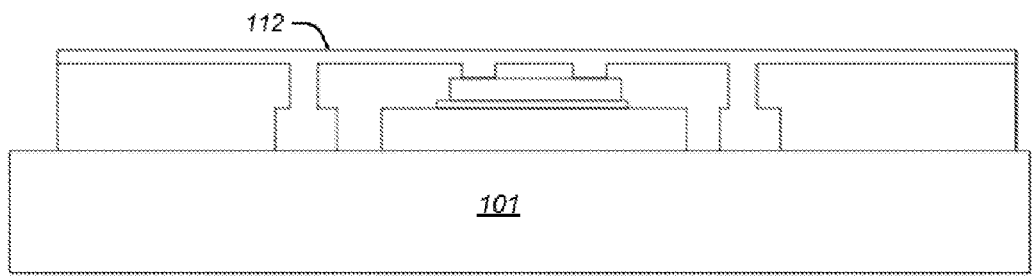
Figure 1L:
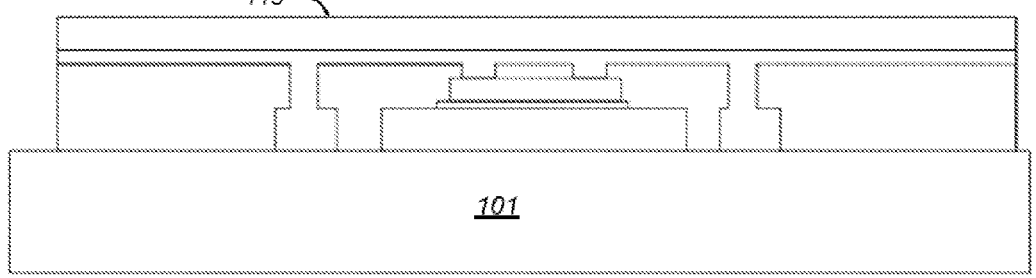
Figure 1M:
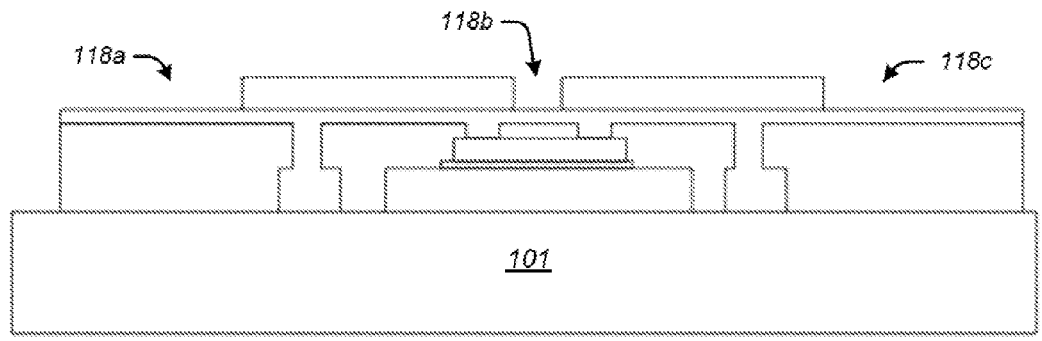
Figure 1N:
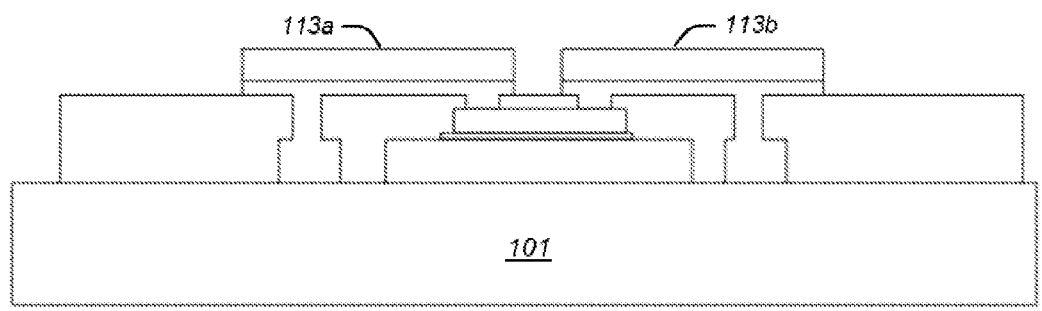
Figure 1O:
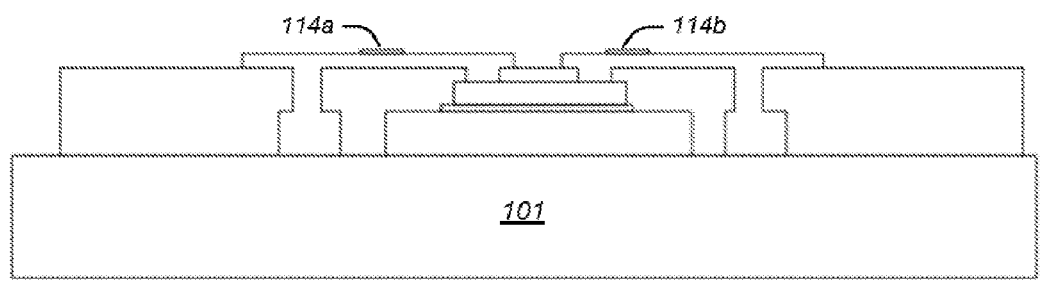
Figure 1P:
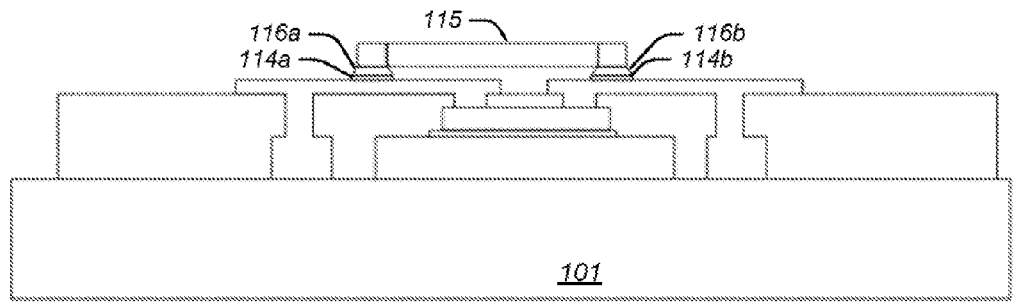
Figure 1Q:
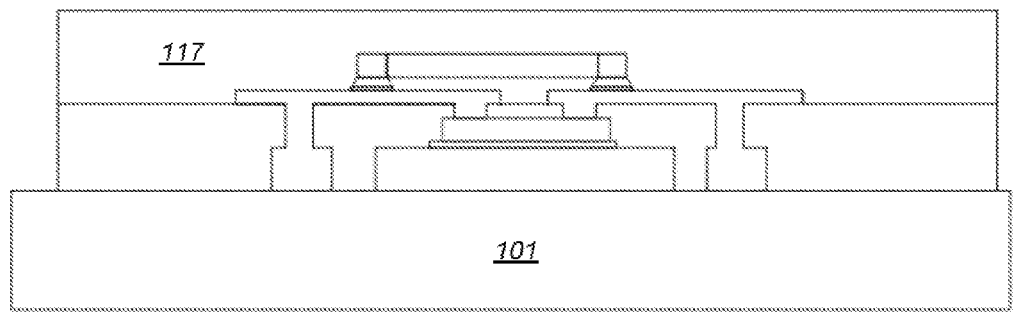
Figure 1R:
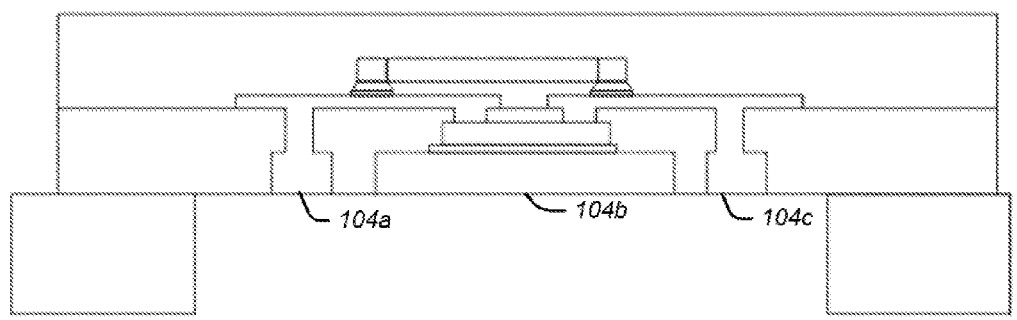

FIGS. 1A-1R illustrate an example of a process for creating an integrated circuit package, such as an embedded die package, that contains a heat spreader 104b that has a solderable surface 120 that forms part of an exterior surface 122 of the integrated circuit package. The silicon side of an internal semiconductor die 108 may be affixed both electrically and thermally to an internal surface of the heat spreader 104b. This package may enable the silicon side of the internal semiconductor die 108 to be connected both thermally and electrically to a printed circuit board (PCB) using conventional surface mount technology (SMT). The surface area of the heat spreader 104b that is affixed to the semiconductor die 108 may be larger than the area of the surface of the semiconductor die 108 to which it is affixed to increase the area of thermal dissipation. The solderable surface 120 of the heat spreader 104b may be soldered to a PCB on which the integrated circuit package is mounted. The process illustrated in FIGS. 1A-1R may use molded interconnect substrate (MIS) technology.

In FIG. 1A, a base metal layer 101 (which may instead be a carrier layer) may serve as a substrate for an electroplating seed layer. The base metal layer 101 may be patterned with photoresist film 102 (e.g., a dry film laminate photoresist) and processed to expose underlying base metal regions 103a, 103b, and 103c for plating, as illustrated in FIG. 1B. Photoresist processing may be achieved, for example, using laser direct write, development, and etching steps.

As illustrated in FIG. 1C, the opened base metal regions 103a, 103b, and 103c may be electroplated to provide conductive regions 104a and 104c and the heat spreader 104b, which may serve as electrical connections to the semiconductor die 108. The conductive regions 104a and 104c and the heat spreader 104b may be of any thickness, such as between 5 and 100 microns. The conductive regions 104a and 104c and the heat spreader 104b may instead be created using a different method, such as a deposition process, such as sputtering.

One of these conductive regions, such as the heat spreader 104b, may later be attached to the bottom of and serve as a heat spreader in connection with the semiconductor die 108, as will later be discussed. The heat spreader 104b may be made of a thermally-conductive material, meaning a material with a thermal conductivity coefficient that may be greater than 2.0 W/mK, but no less than 0.4 W/mK.

The material that makes up the heat spreader 104b may also be conductive and solderable, such as when the material is a metal, such as copper.

A second layer of interconnection conductors may be provided. To this end, second photoresist film 105 may be provided, as illustrate in FIG. 1D. The photoresist film 105 (e.g., a dry film laminate photoresist) may be processed in substantially the same manner as photoresist film 102, e.g., using conventional laser direct write, development, and etching steps. As illustrated in FIG. 1E, the etching steps may create opened areas 106a and 106b in photoresist film 105a, 105b, and 105c. These opened areas 106a and 106b may then be electroplated to provide electrically conductive "stud" layers 107a and 107b, as illustrated in FIG. 1F, which may have any thickness, such as between 75 and 225 microns. Photoresist film 105a, 105b, and 105c may then be removed, as illustrated in FIG. 1G.

All portions of a silicon side of the semiconductor die 108 may be affixed to the heat spreader 104b with an adhesive layer 109, as illustrated in FIG. 1H.

The semiconductor die 108 may have its own interconnection conductive structures 110a and 110b fabricated thereon, The interconnection conductive structures 110a and 110b may have any thickness, such as, for example, between 3 and 100 microns.

The semiconductor die 108 may of any type. For example, the semiconductor die 108 may be silicon, Gallium Arsenide, CMOS, DMOS, or analog. The semiconductor die 108 may have any size. For example, the semiconductor die 108 may have a thickness of between 75 and 200 microns.

The adhesive layer 109 may have any size. For example, the adhesive layer 109 may span across the entire area of the silicon side of the semiconductor die 108. The adhesive layer 109 may be a thermally, electrically conductive, and solderable material, such as Ablestik 84-1 LMISR4 epoxy or SnSb solder. The adhesive layer 109 may have any thickness, such as between 6 and 75 microns.

The base metal layer 101 may then be over-molded using non-electrically conductive encapsulation material 111, as illustrated in FIG. 1I. The encapsulation material 111 may completely cover and extend over the top of the stud layers 107a and 107b and the interconnection conductive structures 110a and 110b. For example, the height of the encapsulation material 111 may be between 60 and 600 microns.

The encapsulation material 111 may be planarized or ground down to expose the tops of the stud layers 107a and 107b and the interconnection conductive structures 110a and 110b, as illustrated in FIG. 1J. Complete exposure may require, for example, removal of between 50 and 500 microns from the top of the encapsulation material 111. If the tops of interconnection conductive structures 110a and 110b are not tall enough, it may be necessary to drill down into the encapsulation material 111 to reach them, such as with a laser. Additional conductive studs may instead be added.

An additional conductive routing layer 112 may be added on top of the exposed conductors, such as by electroplating or sputtering, as illustrated in FIG. 1K, to electrically connect the stud layers 107a and 107b to the interconnection conductive structures 110a and 110b, respectively. To pattern conductive routing layer 112, photoresist layer 113 may be provided, as illustrated in FIG. 1L.

Conventional photoresist processing, development, and etching may again be used to provide openings 118a, 118b, and 118c to allow the conductive routing layer 112 to be etched, as illustrated in FIG. 1M.

Conductive routing layer 112 may then be etched using any suitable etching process, as illustrated in FIG. 1N. Photoresist layers 113a and 113b may then be removed, as illustrated in FIG. 1O. Etched and exposed conductive routing layer 112 can be planarized with a grinding process, if needed. Additional patterning to create additional conductive layers may be added by repeating the process steps described above in connection with FIG. 1K to FIG. 1N one or more times.

FIG. 1O also illustrates organic solderability preservative (OSP) or anti-tarnish layers 114a and 114b that may be provided by a similar photolithography process to allow one or more additional components to be attached. The additional components may include, for example, a passive circuit element and/or another MIS technology-packaged device.

FIG. 1P shows an additional electronic component 115 being to electrically connected to layers 114a and 114b formed out of an OSP layer through structures 116a and 116b which may, for example, be solder mask material. Additional solder-masking, component attaching, and/or other patternable isolative materials may be included by repeating one or more of the foregoing steps, such as the steps illustrated in FIGS. 1O and 1P.

The resulting structure may be completely enclosed by over-molding using non-conductive encapsulation material 117, as illustrated in FIG. 1Q. The over-molding may form a cap having any thickness, such as between 500 and 4000 microns.

All or portions of the base metal layer 101 may be selectively removed by etching. FIG. 1R illustrates the removal of a portion thereof. The exposed surfaces of conductive regions 104a and 104c and the exposed solderable surface 120 of the heat spreader 104b may be plated using a suitable lead finish. Solder connections to the exposed surfaces of conductive regions 104a and 104c may be made and thus serve as electrical connections to conductive structures 110a and 110b on the top of a circuit side of the semiconductor die 108. Similarly, a solder connection may be made to the entire exposed solderable surface 120 of the heat spreader 104b, thus providing both an electrical and thermal connection to the silicon side of the semiconductor die 108.

Numerous embedded integrated circuit packages of one of the types described above may be formed on the same substrate, such as the same base metal layer 101. Individual finished packages may then be obtained by singulation.

Figure 2A:
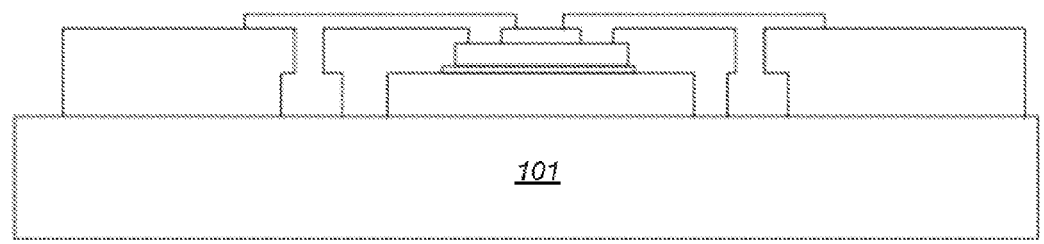
FIGS. 2A-2I illustrate an example of a process for creating an integrated circuit package, such as an embedded die package, that includes multiple routing layers and that contains a heat spreader that has a solderable surface that forms part of an exterior surface of the integrated circuit package.
Figure 2B:
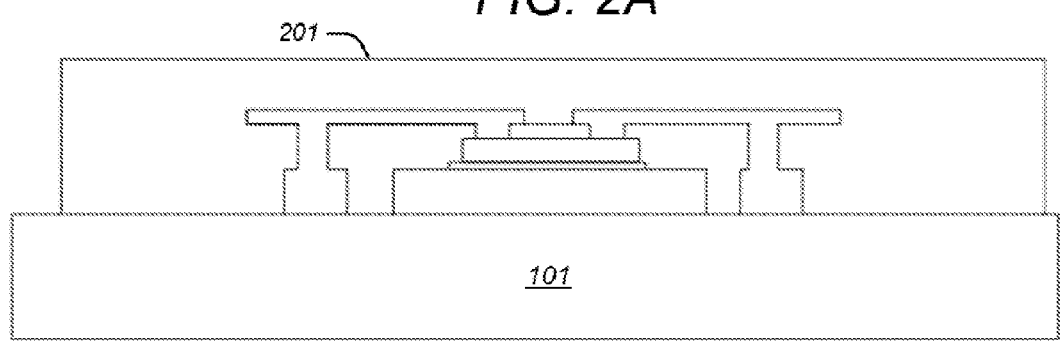
Figure 2C:
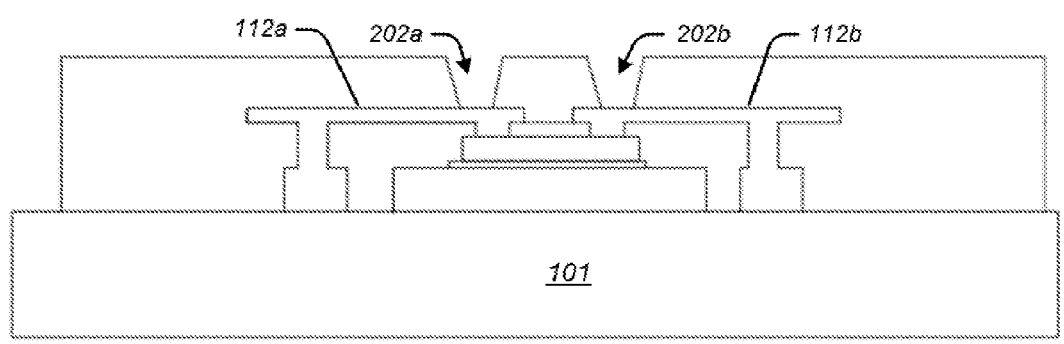

FIGS. 2A-2I illustrate an example of a process for creating an integrated circuit package, such as an embedded die package, that includes multiple routing layers and that contains a heat spreader that has a solderable surface that forms part of an exterior surface of the integrated circuit package. FIG. 2A illustrates the structure of FIG. 1N after removal of photoresist layers 113a and 113b. Thereafter, an over-molding step may provide non-conductive encapsulation material 201 at any thickness, such as between 5 and 150 microns. Laser drilling (e.g., using a CO2 infrared laser) may be used to create via openings 202a and 202b in encapsulation material 201 to underlying routing layers 112a and 112b, as illustrated in FIG. 2C.

Figure 2D:
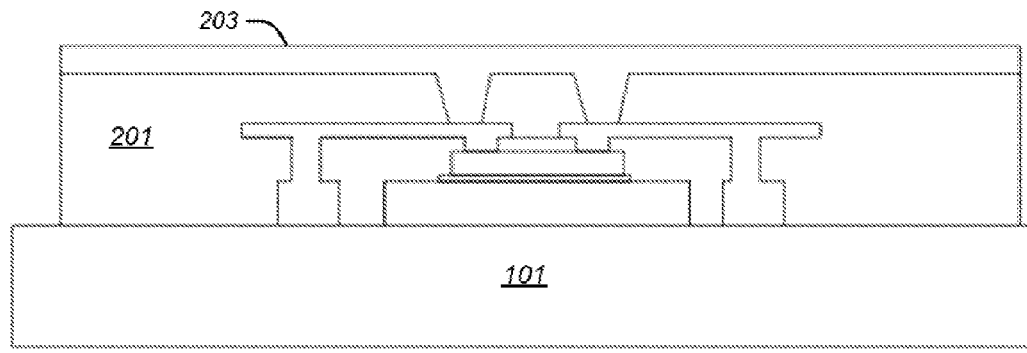

A conductive routing layer 203 (e.g., copper) may then be provided by electroplating or sputtering over the surface of the encapsulation material 201, filling via openings 202a and 202b, as illustrated in FIG. 2D. A planarization process may be applied to ensure uniformity on the surface of the conductive routing layer 203.

Figure 2E:
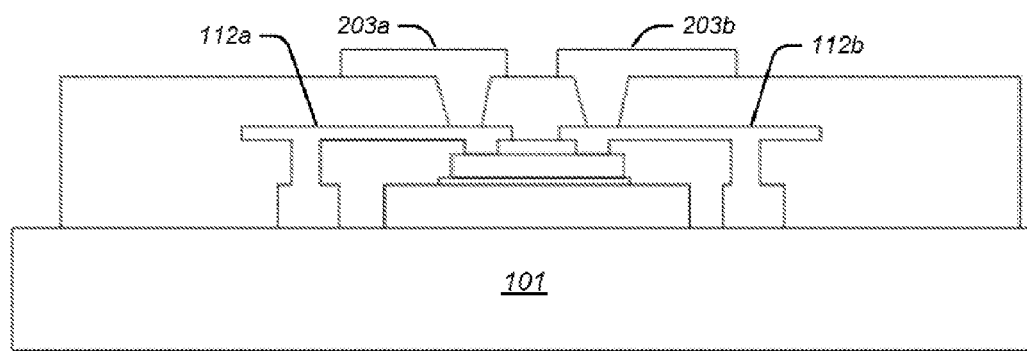
Figure 2F:
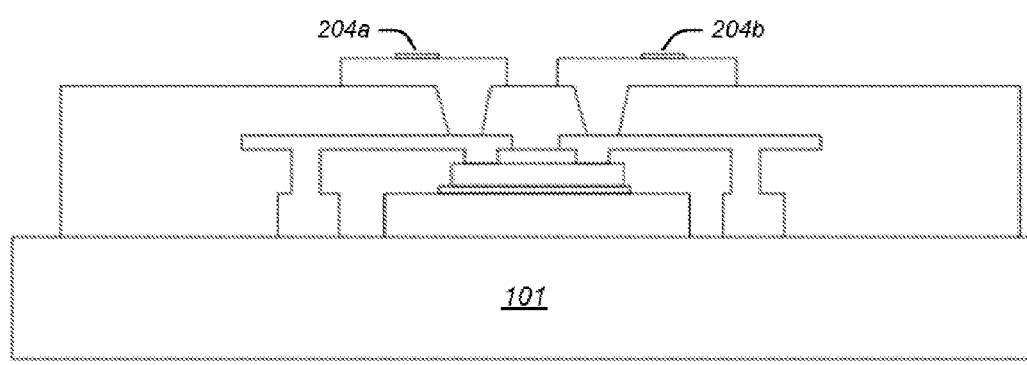
Figure 2G:
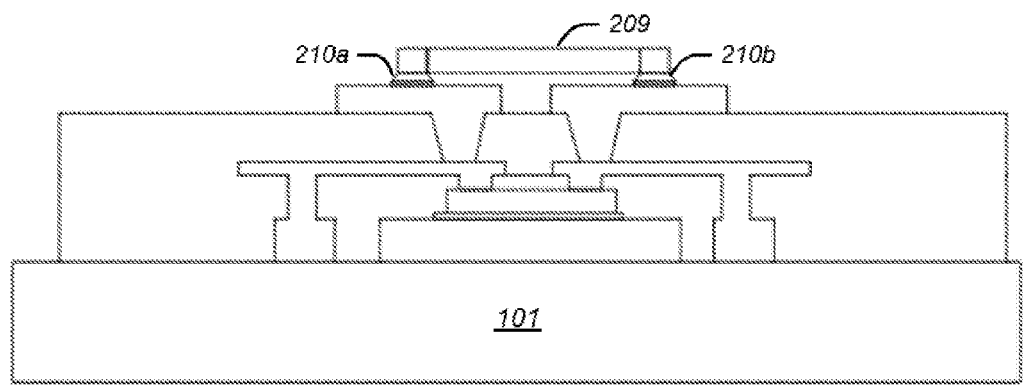
Figure 2H:
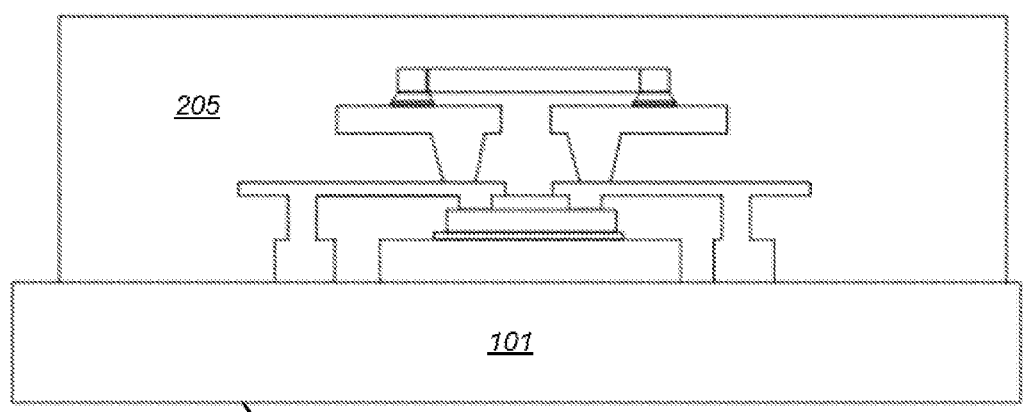
Figure 2I:
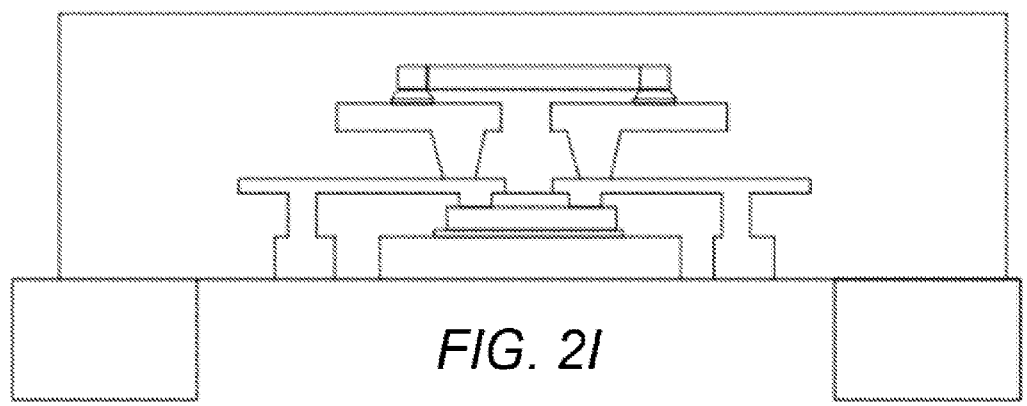

The conductive routing layer 203 may then be patterned and etched to provide a second layer of interconnection traces 203a and 203b (the first layer of interconnection being formed out of routing layers 112a and 112b, as shown in FIG. 2E. An OSP layer or anti-tarnish layer may be applied to provide OSP or anti-tarnish structures 204a and 204b, as shown in FIG. 2F using, for example, the process discussed above with respect to FIG. 1O. An electrical component 209 may then be attached using solder-mask material 210a and 210b, as illustrated in FIG. 2G, in the manner discussed above with respect to attachment of electrical component 115 using solder mask material 116a and 116b in FIG. 1P. The resulting structure may then be encapsulated using an over-molding step with non-conductive encapsulation material 205, as illustrated in FIG. 2H. The encapsulation material 205 may be, for example, 1 mm to 3 mm thick. In the same manner discussed above with respect to FIG. IR, the embedded integrated circuit package may be completed by etching of the base metal layer 101, as illustrated in FIG. 2I. Multiple instances of the integrated circuit package that is illustrated in FIG. 2H may be on a single base metal later, in which case each instance may be singulated from the others.

The heat spreader technology that has been described above may be applied to other type of integrated circuit packages. For example, a pre-molded MIS substrate may instead be formed with a landing pattern that allows a bumped die (e.g., a semiconductor die with solder bumps attached to the pin pads) to be attached to it in a "flip-chip" manner. After the bumped die is attached to the pre-molded MIS substrate, the resulting structure may then be encapsulated by over-molding it with a non-conductive encapsulation material. Openings may then be created (e.g., using laser drilling) for connections to the silicon side of the semiconductor die and to the underlying substrate. A conductor layer may then be plated or sputtered over the surface of the encapsulation, which may then be patterned and planarized (if needed) to provide interconnection traces. Isolation material may then be provided and patterned over the interconnection layer to define solderable external pads.

Figure 3A:
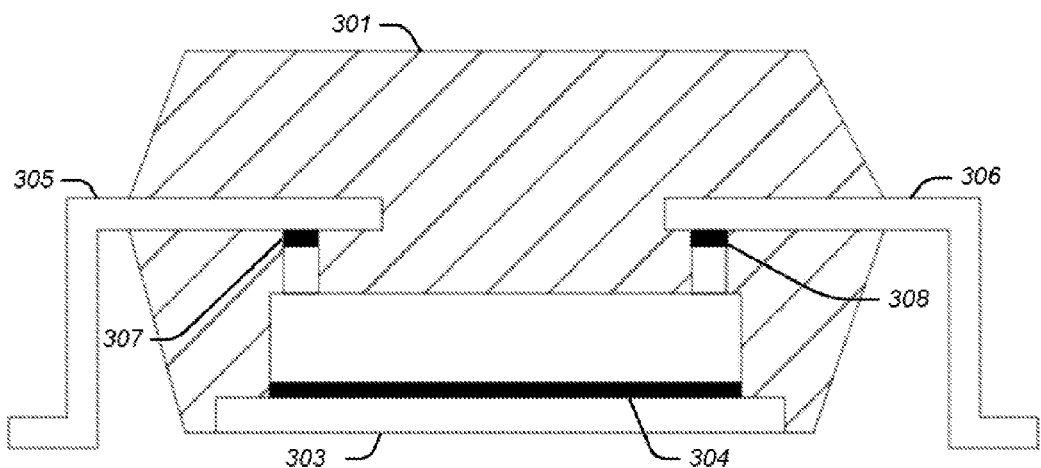
FIGS. 3A-3B each illustrate a different type of integrated circuit package, such as flipchip packages, that each contain a heat spreader that has a solderable surface that forms part of an exterior surface of the integrated circuit package.
Figure 3B:
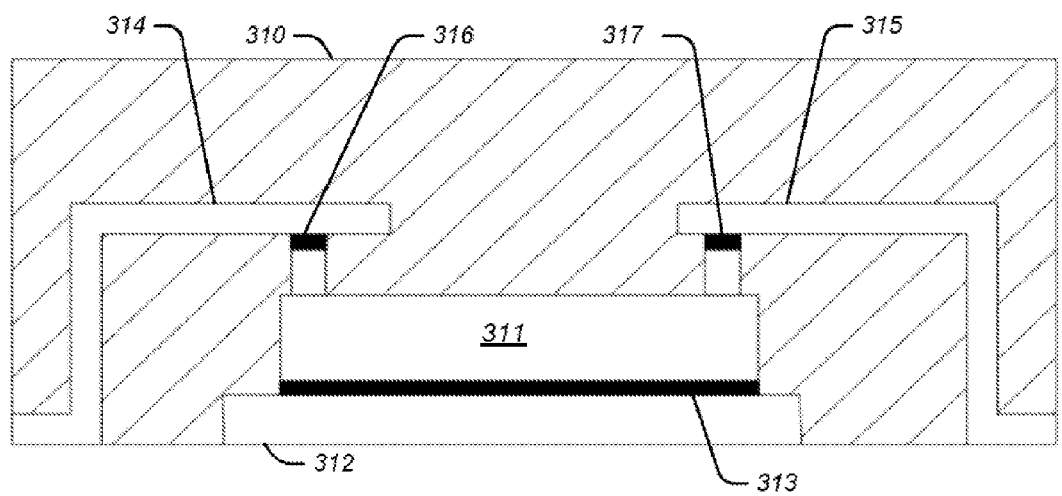

FIGS. 3A-3B each illustrate examples of different types of integrated circuit packages, such as flipchip packages, that contain a heat spreader 303 or 312 that each have a solderable surface that forms part of an exterior surface of the integrated circuit package. Each integrated circuit package may include non-conductive encapsulation material 301 or 310, semiconductor dies 302 or 311, heat spreader 303 or 312, adhesives 304 or 313, internal/external lead conductors 305 and 306 or 314 or 315 (which may have been part of a lead frame) and conductive flipchip joints 307 and 308 or 316 and 317. Components 301, 302, 303, 304, 310, 311, 312, and 313 may be the same as the corresponding components discussed above in connection with the embedded die packages embodiments.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, the semiconductor die may include through-silicon vias. The integrated package may also or instead include one or more additional semiconductor dies and heat spreaders stacked vertically.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. An integrated circuit package comprising:
   a semiconductor die that contains an electronic circuit and exposed electrical connections to the electronic circuit;
   a thermally-conductive heat spreader having a first outer surface and a second outer surface substantially parallel to the first outer surface, the first outer surface being affixed to all portions of a silicon side of the semiconductor die in a thermally-conductive manner; and
   non-electrically conductive, encapsulation material completely encapsulating the semiconductor die and the heat spreader, except for the second outer surface of the heat spreader which is solderable and forms part of an exterior surface of the integrated circuit package,
   wherein:
   the integrated circuit package is an embedded die package;
   the semiconductor die is an embedded die;
   the semiconductor die includes a circuit side that is substantially parallel to the silicon side;
   the integrated circuit package further includes at least one electroplated electrical connection to the circuit side of the semiconductor die; and
   the at least one electroplated electrical connection is electrically connected entirely through an electroplated or sputtered conductive routing layer to a terminal in the exterior surface of the integrated circuit package that includes the second outer surface of the heat spreader, the terminal including a leadframe terminal exposed from the encapsulation material at a portion of the exterior surface of the integrated circuit package and a portion of sidewalls of the integrated circuit package.

2. The integrated circuit package of claim 1 wherein the first outer surface of the heat spreader is affixed to the silicon side of the semiconductor die using an adhesive.

3. The integrated circuit package of claim 1 wherein the heat spreader is electrically conductive and is electrically connected to the silicon side of the semiconductor die.

4. The integrated circuit package of claim 1 further comprising at least one additional electrical component that is not part of the semiconductor die.

5. The integrated circuit package of claim 1 further comprising a second thermally-conductive, solderable heat spreader attached to an additional electrical component and having a surface that forms part of an exterior surface of the integrated circuit package.

6. The integrated circuit package of claim 1 wherein the first outer surface of the heat spreader has a larger surface area than that of the silicon side of the semiconductor die.

7. The integrated circuit package of claim 1 wherein the integrated circuit package has a configuration that makes it suitable to solder the second outer surface of the heat spreader to a surface of a circuit board on which the integrate circuit package is mounted.

8. The integrated circuit package of claim 1 wherein the first outer surface of the heat spreader is plated to the silicon side of the semiconductor die.

9. The integrated circuit package of claim 1 wherein the first outer surface of the heat spreader is electroplated to the silicon side of the semiconductor die.

10. The integrated circuit package of claim 1 wherein the first outer surface of the heat spreader is electroless plated to the silicon side of the semiconductor die.

11. The integrated circuit package of claim 1 wherein the at least one electroplated electrical connection is electrically connected to a terminal in an exterior surface of the integrated circuit package, other than the exterior surface that includes the second surface of the heat spreader.

12. The integrated circuit package of claim 11 wherein the surface containing the terminal is substantially parallel to the exterior surface that includes the second surface of the heat spreader.

13. The integrated circuit package of claim 1 wherein the integrated circuit package has a configuration that makes it suitable to solder the second outer surface of the heat spreader to a surface of a circuit board on which the integrate circuit package is mounted.

14. The integrated circuit package of claim 1 wherein the semiconductor die includes through-silicon vias.

15. The integrated circuit package of claim 1 further comprising one or more additional semiconductor dies and heat spreaders stacked vertically.

16. An integrated circuit package comprising:
   a semiconductor die that contains an electronic circuit and exposed electrical connections to the electronic circuit;
   a thermally-conductive heat spreader having a first outer surface and a second outer surface distinct from the first outer surface, the first outer surface being affixed to all portions of a silicon side of the semiconductor die in a thermally-conductive manner; and
   non-electrically conductive, encapsulation material completely encapsulating the semiconductor die and the heat spreader, except for the second outer surface of the heat spreader which is solderable and forms part of an exterior surface of the integrated circuit package,
   wherein:
   the integrated circuit package is an embedded die package;
   the semiconductor die is an embedded die;
   the semiconductor die includes a circuit side that is substantially parallel to the silicon side;
   the integrated circuit package further includes at least one electroplated electrical connection to the circuit side of the semiconductor die; and
   the at least one electroplated electrical connection is electrically connected entirely through an electroplated or sputtered conductive routing layer to a terminal in the exterior surface of the integrated circuit package that includes the outer second surface of the heat spreader, the terminal including a leadframe terminal exposed from the encapsulation material at a portion of the exterior surface of the integrated circuit package and a portion of sidewalls of the integrated circuit package.

* * * * *